United States Patent
Oh (10) Patent No.: US 11,573,248 B2
(45) Date of Patent: Feb. 7, 2023

(54) TEST SOCKET AND TEST APPARATUS HAVING THE SAME

(71) Applicant: TSE CO., LTD., Chungcheongnam-do (KR)

(72) Inventor: Chang Su Oh, Chungcheongnam-do (KR)

(73) Assignee: TSE CO., LTD., Chungcheongnam-do (KR)

(*) Notice: Subject to any disclaimer, the term of this patent is extended or adjusted under 35 U.S.C. 154(b) by 0 days.

(21) Appl. No.: 17/403,348

(22) Filed: Aug. 16, 2021

(65) Prior Publication Data

US 2022/0057433 A1    Feb. 24, 2022

(30) Foreign Application Priority Data

Aug. 21, 2020  (KR) .................... 10-2020-0105310

(51) Int. Cl.
| | |
|---|---|
| G01R 1/04 | (2006.01) |
| G01R 1/067 | (2006.01) |
| G01R 1/073 | (2006.01) |
| G01R 31/00 | (2006.01) |
| G01R 31/26 | (2020.01) |
| G01R 31/27 | (2006.01) |
| G01R 31/28 | (2006.01) |

(52) U.S. Cl.
CPC .................. G01R 1/0441 (2013.01)

(58) Field of Classification Search
CPC .......... G01R 1/04; G01R 1/067; G01R 1/073; G01R 31/00; G01R 31/02; G01R 31/26; G01R 31/27; G01R 31/28
See application file for complete search history.

(56) References Cited

U.S. PATENT DOCUMENTS

| | | | |
|---|---|---|---|
| 7,438,563 B2* | 10/2008 | Chung | G01R 1/0483 439/91 |
| 2015/0084658 A1* | 3/2015 | Lee | G01R 1/0416 324/750.24 |
| 2019/0302145 A1* | 10/2019 | Erdman | G01R 1/0466 |

FOREIGN PATENT DOCUMENTS

KR    10-2006-0062824    6/2006

* cited by examiner

*Primary Examiner* — Neel D Shah (57) ABSTRACT

The present disclosure discloses a test socket including an inelastic insulating housing formed of an inelastic insulating material having a plurality of housing holes, and a plurality of electro-conductive parts comprising electro-conductive particles in an elastic insulating material, the electro-conductive parts including an electro-conductive part body having a lower end portion to be connected to a signal electrode of the tester, an upper end portion to be connected to the terminal of the device under inspection, and an electro-conductive part bump connected to the electro-conductive part body to protrude from one or both of an upper and lower surface of the inelastic insulating housing.

10 Claims, 5 Drawing Sheets

FIG. 8

TEST SOCKET AND TEST APPARATUS HAVING THE SAME

CROSS-REFERENCE TO RELATED APPLICATION

This application claims priority of Korean Patent Application No. 10-2020-0105310, filed on Aug. 21, 2020, in the KIPO (Korean Intellectual Property Office), the disclosure of which is incorporated herein entirely by reference.

BACKGROUND OF THE INVENTION

Field of the Invention

The present disclosure relates to a test socket, and more particularly to a test socket configured to electrically connect a device under inspection and a tester to each other, and a test apparatus including the same.

Description of the Related Art

A semiconductor package is formed by integrating fine electronic circuits at a high density, and during a manufacturing process, a test process for the semiconductor package is performed to check whether each electronic circuit is normal. The test process is a process for testing whether the semiconductor package is being normally operated to select normal products and defective products.

For testing the semiconductor package, a test apparatus configured to electrically connect a terminal of the semiconductor package and a tester applying a test signal is utilized. The test apparatus has various configurations depending on the type of semiconductor package to be tested. The test apparatus and the semiconductor package are not directly connected to each other, but indirectly connected through a test socket.

Typically, a pogo socket and a rubber socket have been used as the test socket. Among them, the rubber socket has a configuration in which electro-conductive parts, each of which being formed to have a configuration in which a plurality of electro-conductive particles are contained in a material having elastic force such as silicon, are arranged to be insulated from each other inside an insulating housing formed of a material having elastic force such as silicon. The above rubber socket does not use mechanical means such as soldering or a spring, and has the advantage of being able to achieve a simple electrical connection and has been thus widely used in recent years.

Figure 1:
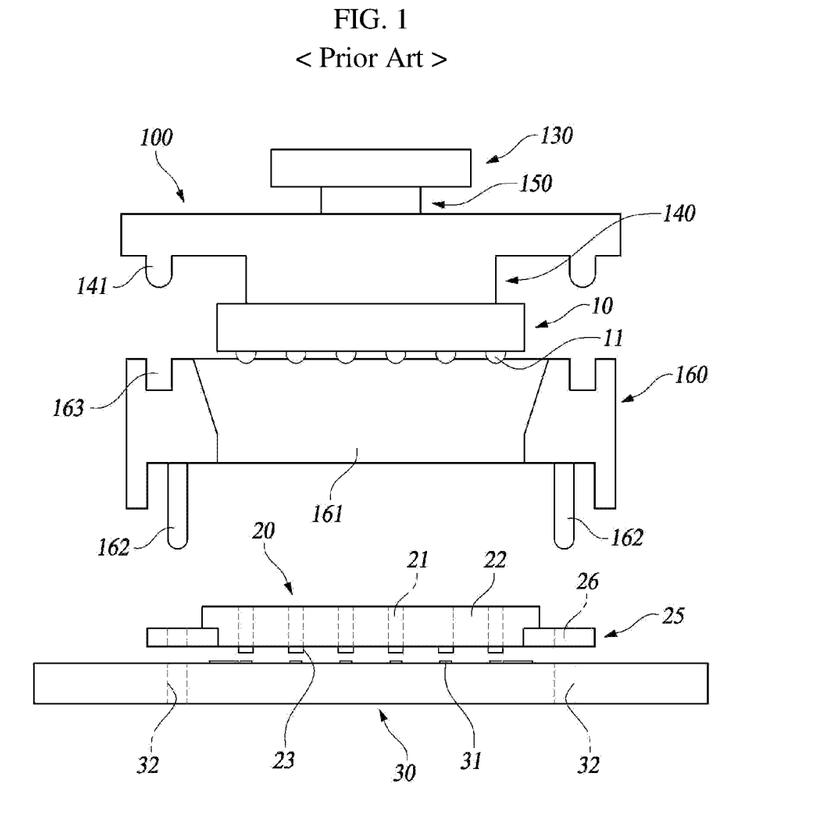
FIG. 1 is a front view depicting a conventional test apparatus.
Figure 2:
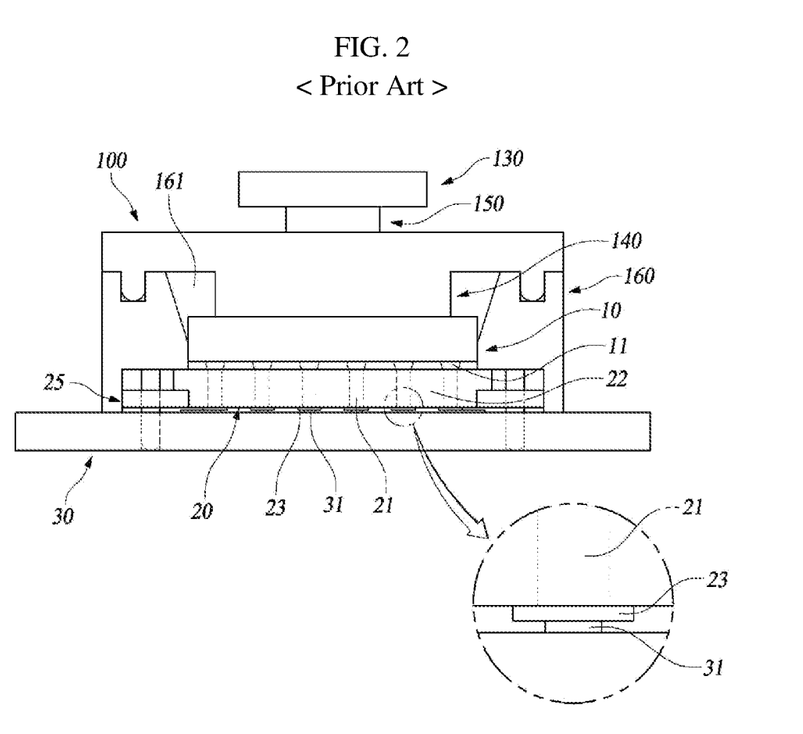
FIG. 2 is view for explaining operation of the conventional test apparatus.

As shown in FIGS. 1 and 2, a conventional test apparatus 100 including a rubber socket-type test socket is provided for connecting a device 10 under inspection having a terminal 11 to a tester 30, which generates a test signal, to test the device 10 under inspection. This test apparatus includes a test socket 20 electrically mediating a signal electrode 31 of the tester 30 and the terminal 11 of the device 10 under inspection through an electro-conductive part 21, a pusher 130 configured to press the device 10 under inspection placed on the test socket 20 towards the tester 30, and a guide housing 160 configured to secure the test socket 20 to tester 30.

The test socket 20 is provided with an insulating housing 22 formed of material having elastic force such as silicon or the like and the plurality of electro-conductive parts 21 arranged to be insulated from each other by the insulating housing 22, and is supported by a frame 25 having an alignment hole 26. Here, each electro-conductive part has a configuration in which a plurality of electro-conductive particles is contained in a material having elastic force such as silicon or the like.

The guide housing 160 is coupled to the tester 30 to secure the test socket 20 to the tester 30. Also, the guide housing 160 may guide the device 10 under inspection towards the test socket 20. An opening 161 through which the device 10 under inspection may pass is provided in the guide housing 160. In addition, the guide housing 160 is provided with an alignment pin 162 inserted into the alignment hole 26 of the frame 25 and the securing hole 32 of the tester 30. The guide housing 160 is coupled with the tester 30 in such a way that the alignment pin 162 passes through the alignment hole 26 of the frame 25 supporting the test socket 20 and is inserted into the securing hole 32 and may align and secure the test socket 20 at a predetermined position on the tester 30.

The above-described conventional test apparatus 100 performs an inspection on the device 10 under inspection in the following manner.

When the pusher 130 pressurizes the device 10 under inspection towards the test socket 20 through a pressurizing part 140 and a buffering part 150, the terminal 11 of the device 10 under inspection is pressed against an upper end portion of the electro-conductive part 21 of the test socket 20, and a lower end portion of the terminal 11 is pressed against the signal electrode 31 of the tester 30. At this time, a test signal generated from the tester 30 is transmitted to the device 10 under inspection through the test socket 20 to conduct an electrical test on the device 10 under inspection.

At this time, the amount of contact stroke applied to the test socket is determined by a stroke limiting part 141 located at a periphery of a pressurizing part of the pusher pressurizing the device under inspection, a vertical thickness of a stopper part 163 of the guide housing 160 located at a periphery of the electro-conductive part of the test socket, a thickness of the device under inspection, a height of the test socket, and the like.

However, the conventional test apparatus has difficulty in precise stroke control due to an addition of a thickness tolerance of the stroke limiting part 141, a thickness tolerance of the stopper part 163, a height tolerance of the test socket 20, and a thickness tolerance of the device 10 under inspection.

In addition, if an electro-conductive part bump 23 protruding from a surface of the insulating housing 22 is formed on at least one of upper and lower surfaces of the electro-conductive part 21, a pressurizing force applied to the test socket is intensively exerted on a portion of the electro-conductive part 21, so that high conductivity may be obtained even with the small amount of contact stroke. A configuration in which the electro-conductive part bump 23 is formed on a lower surface of the electrically conductive part is exemplarily shown in FIG. 1.

However, as depicted in FIG. 2, when the electro-conductive part bump 23 is formed on the electro-conductive part 21, a stroke control is not precisely performed. Therefore, when an excessive stroke is applied to the test socket 20, the electro-conductive part bump 23 is excessively compressed and deformed, reducing durability of the test socket.

The above-described information disclosed in the background description is provided only for improving the understanding of the background of the present disclosure, and thus may include the information which does not constitute the prior art.

SUMMARY OF THE INVENTION

The present disclosure is conceived in the light of the above problems. An object of the present disclosure is to provide a test socket reducing difficulty in stroke control caused by a thickness tolerance of a device under inspection and the like, capable of precisely controlling the stroke, and having excellent durability, and a test apparatus including the same.

In order to achieve the above object, the present disclosure provides a test socket provided in a test apparatus in which a device under inspection having a terminal is connected to a tester, which generates a test signal, for testing the device under inspection, the test socket according to the present disclosure may include an inelastic insulating housing formed of an inelastic insulating material and provided with a plurality of housing holes formed therein to pass therethrough in a thickness direction thereof; a plurality of electro-conductive parts formed to have a configuration in which a plurality of electro-conductive particles are contained in an elastic insulating material, the electro-conductive part comprising an electro-conductive part body having a lower end portion to be connected to a signal electrode of the tester placed below the inelastic insulating housing and an upper end portion disposed in the housing hole to be connected to the terminal of the device under inspection placed on the inelastic insulating housing, and an electro-conductive part lower bump connected to the electro-conductive part body to protrude from a lower surface of the inelastic insulating housing; and a lower compression-controlling sheet attached to the lower surface of the inelastic insulating housing and having a through hole formed therein to allow a lower end portion of each electro-conductive part lower bump to be accommodated in the through hole while forming a space portion around the lower end portion. Here, the inelastic insulating housing has an alignment hole passing therethrough in the thickness direction, and the alignment hole is configured to enable an alignment pin of a component for securing the inelastic insulating housing to the tester to pass therethrough.

It is preferable that a volume of the space portion of the through hole is within a range of values greater than 0.2 times and less than 1.2 times a volume of an upper end portion of the electro-conductive part lower bump.

The electro-conductive part may satisfy the follow condition:

$$0.05 \le \frac{Lb}{Lt} \le 0.5$$

where Lt is the sum of a length of the electro-conductive part body and a length of the electro-conductive part lower bump, and Lb is a length of the electro-conductive part lower bump.

The inelastic insulating housing may be formed of polyimide.

The inelastic insulating housing and the lower compression-controlling sheet may be formed of the same material.

The inelastic insulating housing and the lower compression-controlling sheet may be integrally formed with each other.

In the test socket according to the present disclosure, the electro-conductive part comprises an electro-conductive part upper bump connected to the electro-conductive part body to protrude from an upper surface of the inelastic insulating housing, and the test socket may include an upper compression-controlling sheet attached to the upper surface of the inelastic insulating housing and having a through hole formed therein to allow a lower end portion of each electro-conductive part upper bump to be accommodated in the through hole while forming a space portion around the lower end portion.

Preferably, a volume of the space portion of the through hole may be within a range of values greater than 0.2 times and less than 1.2 times a volume of an upper end portion of the electro-conductive part upper bump.

The electro-conductive part may satisfy the follow condition:

$$0.05 \le \frac{Lb}{Lt} \le 0.5$$

where Lt is the sum of a length of the electro-conductive part body and a length of the electro-conductive part upper bump, and Lb is a length of the electro-conductive part upper bump.

In addition, a test socket according to the present disclosure is provided in a test apparatus in which a device under inspection having a terminal is connected to a tester, which generates a test signal, for testing the device under inspection, the test socket may include an inelastic insulating housing formed of an inelastic insulating material and provided with a plurality of housing holes formed therein to pass therethrough in a thickness direction thereof; a plurality of electro-conductive parts formed to have a configuration in which a plurality of electro-conductive particles are contained in an elastic insulating material, the electro-conductive part comprising an electro-conductive part body having a lower end portion to be connected to a signal electrode of the tester placed below the inelastic insulating housing and an upper end portion disposed in the housing hole to be connected to the terminal of the device under inspection placed on the inelastic insulating housing, and an electro-conductive part lower bump connected to the electro-conductive part body to protrude from an upper surface of the inelastic insulating housing; and an upper compression-controlling sheet attached to the upper surface of the inelastic insulating housing and having a through hole formed therein to allow a lower end portion of each electro-conductive part upper bump to be accommodated in the through hole while forming a space portion around the lower end portion, wherein the inelastic insulating housing has an alignment hole passing therethrough in the thickness direction, and the alignment hole is configured to enable an alignment pin of a component for securing the inelastic insulating housing to the tester to pass therethrough.

On the other hand, in order to achieve the above object, the present disclosure provides a test apparatus in which a device under inspection having a terminal is connected to a tester, which generates a test signal, for testing the device under inspection, the test apparatus according to the present disclosure may include a test socket configured to electrically mediate the tester and the device under inspection for enabling a test signal of the tester to be transmitted to the device under inspection; a guide housing coupled to the tester for securing the test socket to the tester, and being provided with an alignment pin inserted into a securing hole of the tester; and a pusher being movable to approach the tester or to be moved away from the tester, thereby providing a pressurizing force capable of pressurizing the device under inspection placed on the test socket towards the tester, wherein the test socket may include an inelastic insulating housing formed of an inelastic insulating material, the inelastic insulating housing being provided with a plurality of housing holes formed therein to pass therethrough in a thickness direction thereof and an alignment hole formed therein to pass therethrough in the thickness direction thereof to allow the alignment pin to pass through the alignment hole; a plurality of electro-conductive parts formed to have a configuration in which a plurality of electro-conductive particles are contained in an elastic insulating material, the electro-conductive part comprising an electro-conductive part body having a lower end portion to be connected to a signal electrode of the tester placed below the inelastic insulating housing and an upper end portion disposed in the housing hole to be connected to the terminal of the device under inspection placed on the inelastic insulating housing, and an electro-conductive part bump connected to the electro-conductive part body to protrude from at least one of upper and lower surfaces of the inelastic insulating housing; and a compression-controlling sheet attached to a surface of the inelastic insulating housing on which the electro-conductive part bump is formed, and having a through hole formed therein to allow a lower end portion of each electro-conductive part bump to be accommodated in the through hole while forming a space portion around the lower end portion.

In the test apparatus according to the present disclosure, by electrically connecting the tester and the device under inspection using the test socket including the inelastic insulating housing formed of an inelastic insulating material and supporting the plurality of electro-conductive parts, a pressurizing force of the pusher may be evenly applied between the device under inspection and the test socket and between the test socket and the tester. Furthermore, when the pusher pressurizes the device under inspection, the electro-conductive part lower bump of the electro-conductive part protruding from the lower surface of the inelastic insulating housing may be elastically deformed to provide the stroke required to connect the terminal of the device under inspection to the tester. Compared to conventional techniques utilizing a rubber socket type test socket, difficulty in stroke control due to a thickness tolerance of a stroke limiting part, a thickness tolerance of a stopper part of the test socket, a height tolerance of the test socket, a thickness tolerance of the device under inspection, or the like is reduced, and it is possible to precisely control of the stroke.

In addition, the lower compression-controlling sheet, which has a through hole formed therein to allow a lower end portion of the electro-conductive part lower bump, which corresponds to the inelastic insulating housing, to be accommodated in the through hole while forming a space portion around the lower end portion, is attached to the inelastic insulating housing and is controlled to allow the space portion to absorb the amount of electro-conductive part lower bump, so it is possible to prevent deterioration of durability caused by excessive compressive deformation of the electro-conductive part lower bump.

Furthermore, since the test socket of the present disclosure utilizes the inelastic insulating housing having the inelastic characteristic as an insulating part supporting the plurality of electro-conductive parts, deformation is minimized and durability is excellent as compared with the conventional test socket.

In addition, in the test socket according to the present disclosure, an alignment hole for assembling it with components including the guide housing and the like and coupled to the tester is formed in the inelastic insulating housing. Therefore, the test socket according to the present disclosure may be assembled with components including the guide housing and the like without a separate frame as in the prior art, and since it is directly assembled with the components such as the guide housing and the like, it can be precisely aligned and arranged on the tester.

In addition, in the test socket according to the present disclosure, the inelastic insulating housing is formed of a material having a relatively low dielectric constant so that electromagnetic wavelength can be propagated well, so the high-frequency signal transmission characteristic can be improved. Furthermore, even if the electro-conductive parts having the same diameter are applied, using an inelastic insulator rather than an elastic insulator is advantageous for improving the signal transmission characteristic, so the signal transmission characteristic of the present disclosure is superior to that of the prior art.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Hereinafter, a test socket according to a preferred embodiment of the present disclosure, and a test apparatus including the same will be described in detail with reference to the accompanying drawings.

Figure 3:
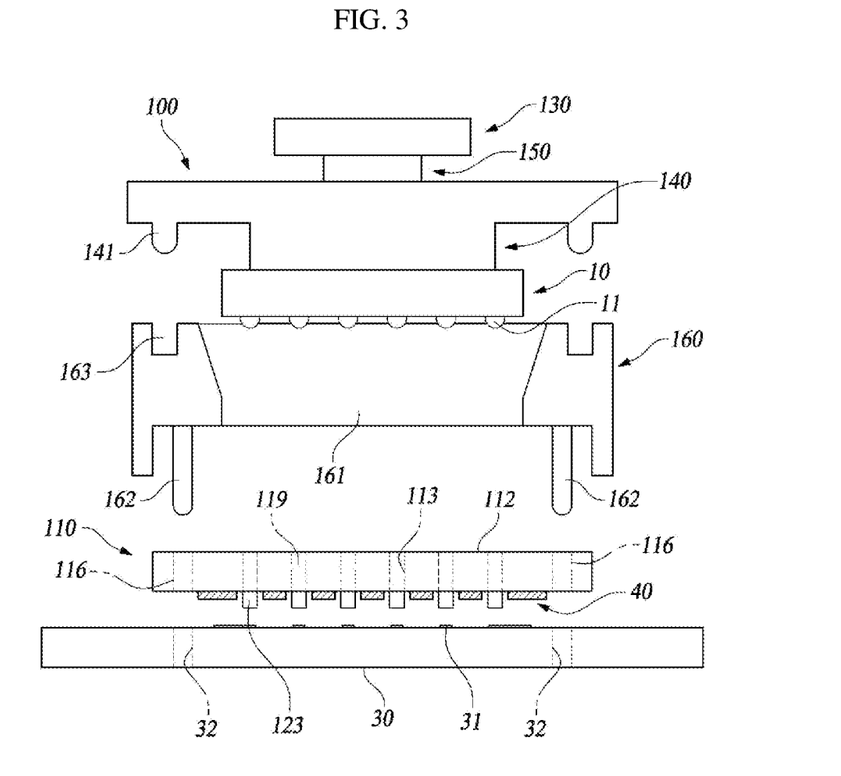
FIG. 3 is a front view illustrating a test apparatus according to one embodiment of the present disclosure.
Figure 4:
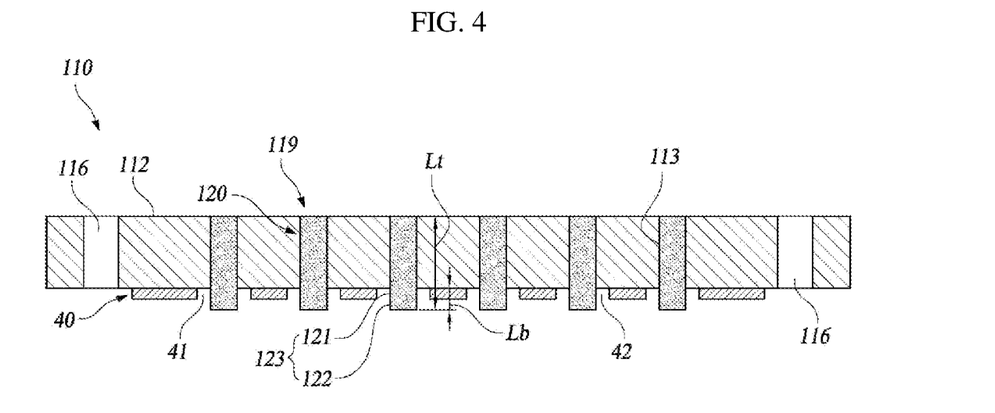
FIG. 4 is a cross-sectional view illustrating a test socket provided in the test apparatus according to one embodiment of the present disclosure.

FIG. 3 is a front view illustrating a test apparatus according to one embodiment of the present disclosure, and FIG. 4 is a cross-sectional view illustrating a test socket provided in the test apparatus according to one embodiment of the present disclosure.

As shown in the drawing, a test apparatus 100 according to one embodiment of the present disclosure is an apparatus for connecting a device 10 under inspection having a terminal 11 to a tester 30, which generates a test signal, to test the device 10 under inspection, and includes a test socket 110 that electrically mediates a tester 30 and the device 10 under inspection, a pusher 130 configured to pressurize the device 10 under inspection placed on the test socket 110 towards the tester 30, and a guide housing 160 for securing the test socket 110 to the tester 30.

The test socket 110 includes an inelastic insulating housing 112 having a plurality of housing holes 113, and a plurality of electro-conductive parts 119 disposed in the plurality of housing holes 113, respectively, and passing through the inelastic insulating housing 112 in a thickness direction.

The inelastic insulating housing 112 is made of an inelastic insulating material, and supports the plurality of electro-conductive parts 119 to be spaced apart from each other. The housing hole 113 may be formed to have a uniform width so as to pass through the inelastic insulating housing 112 in the thickness direction, or may be formed to have a configuration in which at least one of an upper end and a lower end thereof has a width gradually increased toward an upper surface or a lower surface of the inelastic insulating housing 112.

By disposing the electro-conductive part 119 in the housing hole 113, a lower end portion of the electro-conductive part is connected to the signal electrode 31 of the tester 30 placed below the inelastic insulating housing 112, and an upper end portion may be connected to the terminal 11 of the device 10 under inspection placed above the inelastic insulating housing 112. The electro-conductive part 119 includes an electro-conductive part body 120 positioned in the housing hole 113 and an electro-conductive part lower bump 123 connected to the electro-conductive part body 120 to protrude from the lower surface of the inelastic insulating housing 112.

The inelastic insulating housing 112 is provided with an alignment hole 116 formed therein and penetrating through the inelastic insulating housing 112 in the thickness direction together with the housing hole 113. The alignment hole 116 is disposed to be biased toward an edge of the inelastic insulating housing 112 rather than the housing hole 113. The alignment pin 162 of the guide housing 160 is inserted into the alignment hole 116.

The inelastic insulating housing 112 may be made of engineering plastic such as polyimide and the like, or various other inelastic insulating materials.

The inelastic insulating housing 112 is not easily elastically deformed like the elastic insulating part of the conventional rubber socket, but preferably has the bending deformation characteristic. This characteristic increases resistance to a device under inspection which can be warping-deformed in various shapes, and is advantageous in increasing durability and lifespan. In particular, the bending deformation characteristic greatly affects the durability of the inelastic insulation housing 112 when the inelastic insulation housing 112 has the warping deformation characteristic. The inelastic insulating housing 112 may be warping-deformed when manufactured or handled. The inelastic insulating housing 112 having the warping deformation characteristic should be bending-deformed in a direction to which it is unfold when it is mounted to the tester 30 and comes into contact with the device 10 under inspection, whereby the electro-conductive part 119 disposed thereon may stably come into contact with a terminal of the device under inspection.

The inelastic insulating housing 112 needs to have the hardness within an appropriate range so that it is not easily elastically deformed by a pressurizing force of the pusher 130, but can be bending-deformed. That is, it is preferable that the inelastic insulating housing 112 has the hardness enough to cause a bending deformation even with the minimum pressurizing force of the pusher 130 without generating a compressive deformation due to the maximum pressurizing force of the pusher 130.

A soft film material is not represented using a hardness value showing the amount of dents such as the Vickers hardness, but is expressed using a hardness showing a surface scratching degree caused by a pencil. Typically, a hardness representing this surface scratching degree is expressed within a range of 8B, which is the lowest hardness, to 9H, which is the highest hardness.

A preferred hardness of the inelastic insulating housing 112 is in the range of 3B to 6H. When the inelastic insulating housing 112 has the hardness less than 3B, the inelastic insulating housing 112 may be compressively deformed by the maximum pressurizing force of the pusher 130, and a surface of the inelastic insulating housing 112 may be damaged by repeated contact with the device 10 under inspection. On the other hand, if the hardness of the inelastic insulating housing 112 exceeds 6H, when the inelastic insulating housing 112 is warping-deformed, due to the minimum pressurizing force of the pusher 130, it is difficult for the inelastic insulating housing 112 to be bending-deformed in the direction in which it is being unfolded. In this case, the electro-conductive part 119 provided in the inelastic insulating housing 112 is not stably connected to the signal electrode of the tester or the terminal of the device under inspection, and this may lead to a damage of the inelastic insulating housing 112 or a breakage of the device under inspection.

A lower compression-controlling sheet 40 having a predetermined thickness is attached to the lower surface of the inelastic insulating housing 112. The lower compression-controlling sheet 40 is an integrated sheet in which a through hole 41 having a diameter larger than that of the electro-conductive part lower bump 123 is formed at a position corresponding to the electro-conductive part lower bump 123, and may be formed to have a thickness which is an about half of the thickness of the electro-conductive part lower bump 123. In addition, the lower compression-controlling sheet is attached in a configuration in which a lower end portion 121 of the electro-conductive part lower bump 123 corresponding to the inelastic insulating housing 112 is accommodated in the through hole 41 while forming a space portion 42 around the lower end portion. Therefore, the space portion 42 is provided in a region other than a region occupied by the electro-conductive part lower bump 123 (that is, a region of lower end portion 121 of the electro-conductive part lower bump 123) in a region of the through hole 41 of the lower compression-controlling sheet 40.

In addition, an upper end portion 122 of the electro-conductive part lower bump 123 is defined as a portion protruding from the lower compression-controlling sheet 40, and an upper end portion 122 of an electro-conductive part upper bump 124 which will be described later is also defined as a portion protruding from an upper compression-controlling sheet 400.

A height of the upper end portion 122 of the electro-conductive part lower bump 123, that is, the portion protruding from the lower compression-controlling sheet 40 may be appropriately selected according to a diameter of the electro-conductive part, a pitch of the electro-conductive parts, etc., but is preferably within a range of 5 μm to 500 μm, more preferably within the range of 10 μm to 300 μm, and most preferably within the range of 25 μm to 200 μm.

The lower compression-controlling sheet 40 may be made of the same material as the inelastic insulating housing 112. Therefore, the lower compression-controlling sheet 40 may be made of engineering plastics such as polyimide, or various other inelastic insulating materials. Of course, the lower compression-controlling sheet 40 and the inelastic insulating housing 112 may be made of different materials.

The lower compression-controlling sheet 40 may be disposed on an inner region in which the alignment hole 116 disposed to be biased towards an edge of the inelastic insulating housing 112 is formed, or may be disposed up to a region including the alignment hole 116. Of course, when the lower compression-controlling sheet 40 is disposed up to the region including the alignment hole 116 of the inelastic insulating housing 112, the alignment hole 116 into which the alignment pin 162 of the guide housing 160 is inserted is also formed in the lower compression-controlling sheet 40.

The space portion 42 formed between the lower compression-controlling sheet 40 and the electro-conductive part lower bump 123 acts as a space for controlling the amount of compression of the electro-conductive part lower bump 123. When the test socket 110 is pressurized by a pressurizing force of the pusher 130, the electro-conductive part lower bump 123 may be compressed until the lower surface of the inelastic insulating housing 112 comes into contact with the upper surface of the tester 30. Because of this contact, excessive compressive deformation of the electro-conductive part lower bump 123 is prevented and, therefore, durability of the test socket 110 is improved.

In the present disclosure, by providing the space portion 42 between the lower compression-controlling sheet 40 and the electro-conductive part, and adjusting a volume of the space portion 42, it is possible to provide the characteristic of the test socket 110 required in various test environments. If a volume is reduced, a pressurizing force of the pusher 130 may be increased to increase a contact load between the test socket and the terminal of the device 10 under inspection or the tester 30, so the conductivity can be further strengthened. Conversely, if a volume is increased, the above contact load can be lowered to lengthen the lifespan of the test socket, so it has the advantage of being able to adjust the characteristic of the test socket according to the test environment.

In addition, if a volume of the space portion 42 is small, the electro-conductive part lower bump 123 is compressed, so the lower compression-controlling sheet 40 supports the electro-conductive part lower bump 123 accommodated in the through hole 41 to prevent the electro-conductive part lower bump 123 from being deformed. Conversely, if a volume is increased, even though the electro-conductive part lower bump 123 is compressed as much as possible, it may be compressed only to the lower surface of the lower compression-controlling sheet 40 made of an inelastic material, so it is also possible to prevent excessive compressive deformation of the electro-conductive part lower bump.

Preferably, it is preferable that a volume of the space portion 42 of the through hole 41 is within a range of values greater than 0.2 times and less than 1.2 times a volume of the upper end portion 122 of the electro-conductive part lower bump 123. When a volume of the space portion 42 is less than 0.2 times a volume of the upper end portion 122 of the electro-conductive part lower bump 123, the amount of deformation of the electro-conductive part lower bump 123 cannot be sufficiently absorbed by the space portion, and if a volume of the space portion 42 is 1.0 times a volume of the upper end portion 122 of the electro-conductive part lower bump 123, theoretically the space portion 42 may accommodate all the upper end portion 122 of the electro-conductive part lower bump 123, compression may not be performed smoothly due to the flow of the electro-conductive part lower bump 123. It is preferable that in order to easily compress the electro-conductive part lower bump 123, the space portion 42 is formed to have a volume slightly larger than, preferably less than 1.2 times a volume of the upper end portion 122 of the electro-conductive part lower bump 123.

The electro-conductive part 119 may be formed to have a configuration in which a plurality of electro-conductive particles are contained in an elastic insulating material so that the electro-conductive part may be connected to the signal electrode 31 of the tester 30 and the terminal 11 of the device 10 under inspection. Some of the plurality of electro-conductive parts 119 may be used as a signal transmission terminal which is in contact with the signal electrode 31 of the tester 30, and some of them may be used as a ground terminal.

As an elastic insulating material constituting the electro-conductive part 119, a heat-resistant polymer material having a crosslinked structure, for example, silicone rubber, polybutadiene rubber, natural rubber, polyisoprene rubber, styrene-butadiene copolymer rubber, acrylonitrile-butadiene copolymer rubber, styrene-butadiene-diene block copolymer rubber, styrene-isoprene block copolymer rubber, urethane rubber, polyester rubber, epichlorohydrin rubber, ethylene-propylene copolymer rubber, ethylene-propylene-diene copolymer rubber, soft liquid epoxy rubber, and the like may be employed.

In addition, as the electro-conductive particles constituting the electro-conductive part 119, particles having magnetism may be employed such that they may be reacted by a magnetic field. For example, as the electro-conductive particles, particles obtained by plating a surface of core particle, for example, particles of metals exhibiting magnetism, such as iron, nickel, cobalt, etc., or alloy particles thereof, or particles containing these metals, or particles of these metals, with a metal having excellent electro-conductivity, such as gold, silver, palladium, radium, or the like; particles obtained by plating a surface of core particle, for example, non-magnetic metal particles, inorganic substance particles such as glass beads or the like, and polymer particles, with electro-conductive magnetic substance such as nickel, cobalt, or the like; or particles obtained by plating core particle with electro-conductive magnetic substance and a metal having excellent electro-conductivity may be employed.

The electro-conductive part 119 has a structural feature as below.

$$0.05 \leq \frac{Lb}{Lt} \leq 0.5$$

Here, Lt is the sum of a length of the electro-conductive part body 120 and a length of the electro-conductive part lower bump 123, and Lb represents a length of the electro-conductive part lower bump 123.

The electro-conductive part 119 having the above configuration may smoothly provide a stroke necessary to connect the terminal 11 of the device 10 under inspection to the tester 30. In addition, the electro-conductive part 119 including the electro-conductive part lower bump 123 distributes the load when the terminal 11 of the device 10 under inspection comes into contact therewith, so this is advantageous for preventing damage to the device 10 under inspection.

That is, the electro-conductive part lower bump 123 protruding from the lower surface of the inelastic insulating housing 112 has a relatively high degree of freedom because it has a portion not held by the inelastic insulating housing 112. Therefore, if the electro-conductive part lower bump 123 is designed to have an appropriate length, it is possible to induce a fine movement of the test socket 110 when the device 10 under inspection comes into contact therewith. In addition, if the test socket 110 is finely moved upward, downward, forward, backward or from side to side when the device 10 under inspection comes into contact therewith, it is possible to obtain an effect of distributing a load caused by the contact between the test socket and the device 10 under inspection and of buffering an impact.

A length of the electro-conductive part lower bump 123 may be appropriately determined according to a width or the number of the electro-conductive part 119. If a length of the electro-conductive part lower bump 123 is too short, fine movement of the test socket 110 cannot be induced, and if a length of the electro-conductive part lower bump 123 is too long, there is a problem in that durability is deteriorated.

When a ratio of the length Lb of the electro-conductive part lower bump 123 to the length Lt which is the sum of a length of the electro-conductive part body 120 and a length of the electro-conductive part lower bump 123 is less than 0.05, it is difficult to smoothly provide a stroke required to connect the terminal 11 of the device 10 under inspection to the tester 30, and it is not possible to induce fine movement of the test socket 110, so there is no load distribution effect.

On the other hand, when a ratio of the length Lb of the electro-conductive part lower bump 123 to the length Lt which is the sum of a length of the electro-conductive part body 120 and a length of the electro-conductive part lower bump 123 exceeds 0.5, there are problems in that durability of the test socket 110 is deteriorated and product life is shortened. That is, if the length Lb of the electro-conductive part lower bump 123 is excessively long, when contacting with the device 10 under inspection, the electro-conductive part lower bump 123 is bent, whereby the electro-conductive part lower bumps 123 come into contact with each other to cause a short failure or the electro-conductive part lower bump 123 may be damaged.

The pusher 130 is configured to be moved towards the tester 30 or moved away from the tester 30 to provide a pressurizing force by which the device 10 under inspection disposed on the test socket 110 may be pressurized towards the tester 40. The pusher 130 may receive a moving force from a driving part (not shown) to be moved.

A pressurizing part 140 and a buffering part 150 are provided below the pusher 130, and the pusher 130 may pressurize the device 10 under inspection through the pressurizing part 140 and the buffering part 150. The pressurizing part 140 comes into contact with an upper surface of the device 10 under inspection to transmit a pressurizing force of the pusher 130 to the device 10 under inspection. The buffering part 150 serves to buffer a pressure applied to the device 10 under inspection by the pusher 130. The buffering part 150 may be made of a material having elasticity such as rubber, silicone or the like, or may take various configurations capable of absorbing shock, such as a structure including a spring or the like.

When the pressurizing part 140 pressurizes the device 10 under inspection, load applied to the device 10 under inspection, due to a buffering action of the buffering part 150, the test socket 110, and the tester 30 by the pusher 130, may be restricted so as not to be excessive. Accordingly, damage or breakage of the device 10 under inspection, the test socket 110, or the tester 30 caused by the excessive pressurizing force may be prevented.

The guide housing 160 is coupled to the tester 30 to secure the test socket 110 to the tester 30. Also, the guide housing 160 may guide the device 10 under inspection towards the test socket 110. An opening 161 through which the device 10 under inspection may pass is provided inside the guide housing 160. In addition, the guide housing 160 is provided with an alignment pin 162 inserted into a securing hole 32 of the tester 30. The guide housing 160 is coupled to the tester 30 in such a way that the alignment pin 162 passes through the alignment hole 116 of the inelastic insulation housing 112 and is inserted into the securing hole 32, and may align the test socket 110 at a predetermined location of the tester 30 and then secure the test socket to the tester.

Compared to the present invention, a conventional rubber socket having an elastic insulating part is coupled to a frame, which is formed of a hard material and has an alignment hole into which an alignment pin of a guide housing is inserted, and is then installed to a tester. Since such a conventional rubber socket is assembled through a separate frame, there is a problem in that alignment accuracy on the tester is deteriorated due to an assembly error between the rubber socket and the frame.

A test socket 110 according to the present disclosure avoids these problems, because the alignment hole 116 for assembling the inelastic insulating housing with the guide housing 160 is formed in the inelastic insulating housing 112, and a distance from the alignment hole 116 to the housing hole 113 in which the electro-conductive part 119 is disposed is constant. In addition, since the test socket 110 is directly assembled with the guide housing 160, it may be precisely aligned and disposed on the tester 30.

Figure 5:
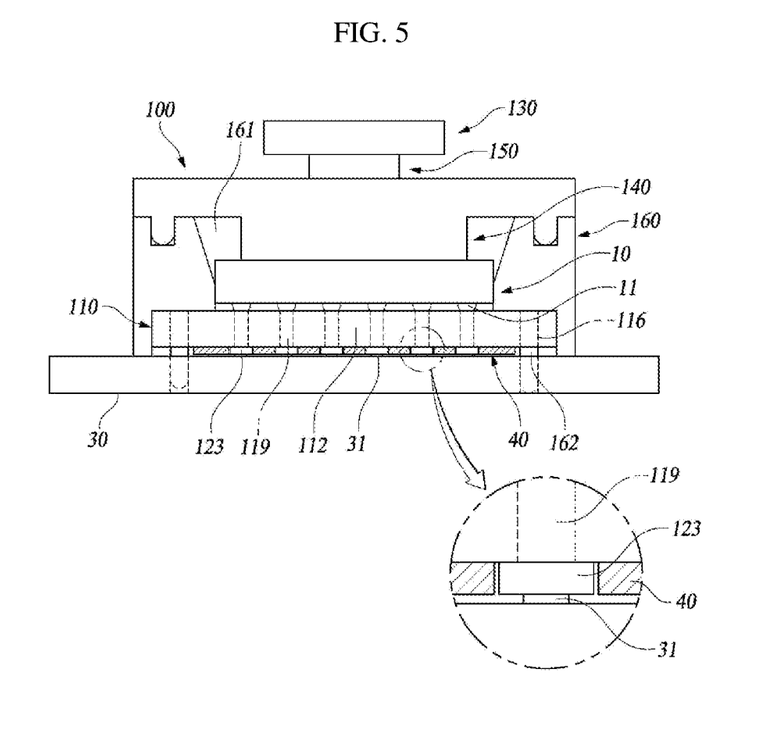
FIG. 5 is a view for explaining operation of the test apparatus according to one embodiment of the present disclosure.

When the device 10 under inspection is inspected, the test apparatus 100 according to one embodiment of the present disclosure is operated in the following manner.

As shown in FIG. 5, when the pusher 130 pressurizes the device 10 under inspection towards the test socket 110 through the pressurizing part 140 and the buffering part 150, the terminal 11 of the device 10 under inspection is pressed against the upper end portion of the electro-conductive part 119 of the test socket 110, and the electro-conductive lower part bump 123 is pressed against the signal electrode 31 of the tester 30. At this time, a test signal generated from the tester 30 may be transmitted to the device 10 under inspection through the test socket 110 to perform an electrical test on the device 10 under inspection.

When the terminal 11 of the device 10 under inspection is pressed against the electro-conductive part 119 of the test socket 110, since the electro-conductive part 119 has elasticity, the terminal 11 enters inside the housing hole 113 while elastically deforming the electro-conductive part 119. At this time, a lower surface of the device 10 under inspection test 10 may come into contact with the upper surface of the inelastic insulating housing 112. In addition, until a lower surface of the lower compression-controlling sheet 40 is brought into contact with an upper surface of the tester 30, the electro-conductive part lower bump 123 of the electro-conductive part 119 may be compressed by a pressurizing force with which the device 10 under inspection pressurizes the test socket 110. As the lower surface of the lower compression-controlling sheet 40 is in contact with an upper surface of the tester 30, the stroke is not increased further.

In this way, the lower surface of the device 10 under inspection comes into contact with the upper surface of the inelastic insulating housing 112 and pressurizes the test socket 110 towards the tester 30, so a pressurizing force applied to the device 10 under inspection may be evenly transmitted to the entire test socket 110, and the plurality of electro-conductive parts 119, the plurality of signal electrodes 31 and the plurality of terminals 11 may be maintained in a contact state with an entirely uniform contact force. Therefore, the plurality of signal electrodes 31 and the plurality of terminals 11 may be maintained in a stable connection state through the test socket 110, so no signal transmission loss occurs and a stable test is possible.

On the other hand, while the pusher 130 pressurizes the device 10 under inspection towards the tester 30, after the lower surface of the test socket 110 is brought into contact with the tester 30, the buffering part 150 is elastically deformed, so no stroke is further applied. In addition, since the buffering part 150 buffers a pressurizing force of the pusher 130, damage or breakage of the device 10 under inspection, the test socket 110, or the tester 30 due to an excessive pressurizing force can be prevented.

As described above, in the test apparatus 100 according to one embodiment of the present disclosure, by electrically connecting the tester 30 and the device 10 under inspection using the test socket 110 including the inelastic insulating housing 112 formed of an inelastic insulating material and supporting the plurality of electro-conductive parts 119 and the lower compression-controlling sheet 40 having the space portion 42, a pressurizing force of the pusher 130 may be evenly applied between the device 10 under inspection and the test socket 110 and between the test socket 110 and the tester 30. Furthermore, when the pusher 130 pressurizes the device 10 under inspection, the amount of elastic deformation of the electro-conductive part lower bump 123 of the electro-conductive part 119 protruding from the lower surface of the inelastic insulating housing 112 may be adjusted by the space portion 42 of the lower compression-controlling sheet 40 to provide the stroke required to connect the terminal 11 of the device 10 under inspection to the tester 30.

As above, in the test apparatus 100 according to one embodiment of the present disclosure, the inelastic insulating housing 112 and the lower compression-controlling sheet 40 of the test socket 110 serve as a stopper. Like a conventional technique utilizing a rubber socket type test socket, accordingly, difficulty in stroke control due to a thickness tolerance of a stroke limiting part, a thickness tolerance of a stopper part of the test socket, a height tolerance of the test socket, a thickness tolerance of the device under inspection, or the like is reduced, and it is possible to precisely control of the stroke. In addition, longevity of the test socket 110 may be improved by a precise control of the stroke.

In addition, since the test socket 110 of the present disclosure utilizes an inelastic insulator as a dielectric substance interposed between the plurality of electro-conductive parts 119, it is possible to manufacture the inelastic insulating housing 112 from a material having an excellent dielectric constant for high-frequency signal transmission. A conventional rubber socket type test socket utilizes silicone rubber having a high dielectric constant as an insulating housing, so it was not easy to improve the high frequency signal transmission characteristic. On the contrary, in the present disclosure, the inelastic insulating housing 112 is formed of a material having a relatively low dielectric constant so that electromagnetic wavelength can be propagated well, so the high-frequency signal transmission characteristic can be improved. In addition, even if the electro-conductive parts having the same diameter are applied, using an inelastic insulator rather than an elastic insulator is advantageous for improving the signal transmission characteristic, so the signal transmission characteristic of the present disclosure is superior to that of the prior art.

Furthermore, since the test socket 110 of the present disclosure utilizes the inelastic insulating housing 112 having the inelastic characteristic as an insulating housing supporting the plurality of electro-conductive parts 119, deformation is minimized and durability is excellent as compared with the conventional test socket.

Figure 6:
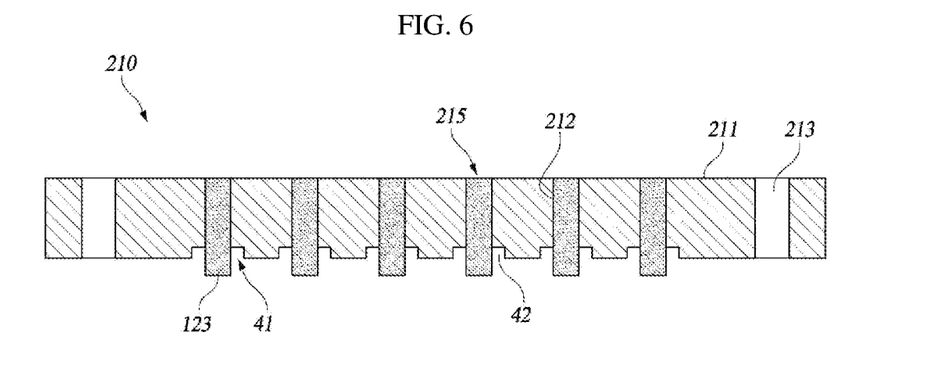
FIGS. 6 to 8 are views illustrating various modifications of the test socket.

On the other hand, a test socket 210 shown in FIG. 6 includes the inelastic insulating housing 211 having a plurality of housing holes 212 and a plurality of alignment holes 213, and a plurality of electro-conductive parts 215 disposed in the plurality of housing holes 212, respectively, to pass through the inelastic insulating housing 211 in the thickness direction. This test socket is formed to have a configuration in which the through hole 41 is formed in the inelastic insulating housing 211, the space portion 42 is formed between an edge of the through hole 41 and a lower end portion of the electro-conductive part lower bump 123 and the electro-conductive part lower bump 123 protrudes from the lower surface of the inelastic insulating housing 211.

This test socket 210 has a configuration in which the inelastic insulating housing 211 and the lower compression-controlling sheet 40 are integrally formed with each other and the amount of compression of the electro-conductive part lower bump 123 may be controlled only by the inelastic insulating housing 211.

Figure 7:
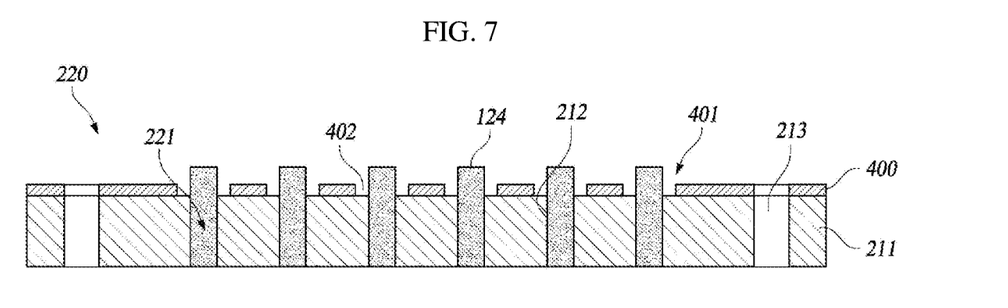

A test socket 220 shown in FIG. 7 includes the inelastic insulating housing 211 having the plurality of housing holes 212 and a plurality of electro-conductive parts 221 disposed in the plurality of housing holes 212, respectively. The electro-conductive part 221 may be formed to have a configuration in which a plurality of electro-conductive particles are contained in an elastic insulating material, and includes an electro-conductive part body positioned in the housing hole 212 and the electro-conductive part upper bump 124 connected to the electro-conductive part body to protrude from the upper surface of the inelastic insulating housing 211.

The upper compression-controlling sheet 400 having a predetermined thickness is attached to the upper surface of the inelastic insulating housing 211. The upper compression-controlling sheet 400 is an integrated sheet in which a through hole 401 having a diameter larger than that of the electro-conductive part upper bump 124 is formed at a position corresponding to the electro-conductive part upper bump 124, and may be formed to have a thickness which is an about half of the thickness of the electro-conductive part upper bump 124. In addition, the upper compression-controlling sheet 400 is attached in a configuration in which a lower end portion of the electro-conductive part upper bump 124 corresponding to the inelastic insulating housing 211 is accommodated in the through hole 401 while forming a space portion 402 around the lower end portion. Therefore, the space portion 402 is provided in a region other than a region occupied by the electro-conductive part upper bump 124 (that is, a region of lower end portion of the electro-conductive part upper bump 124) in a region of the through hole 401 of the upper compression-controlling sheet 400. In addition, an upper end portion of the electro-conductive part upper bump 124 is defined as a portion protruding from the upper compression-controlling sheet 400.

The above-described test socket 220 is particularly useful for inspecting the LGA (land grid array) type device under inspection having a pad-shaped terminal. As illustrated in in FIG. 4, when the electro-conductive part 119 does not protrude, the terminal of the LGA type device under inspection having the pad-shaped terminal does not easily come into contact with the electro-conductive part 119 of the test socket 110. Therefore, when the device under inspection has an LGA (land grid array) type terminal, if the electro-conductive part upper bump 124 is formed on the electro-conductive part 221 to protrude the electro-conductive part, the contact between the electro-conductive part 221 and the terminal is smoothly performed, so it is possible to conduct a reliable inspection. Of course, it is also possible to employ this test socket for the device (10 in FIG. 3) under inspection having a BGA (ball grid array) type terminal (11 in FIG. 3).

In addition, it is possible to form the test socket having a configuration in which the electro-conductive part is provided with the electro-conductive part bumps protruding from the upper surface and the lower surface of the inelastic insulating housing, respectively and the compression-controlling sheets are attached to the upper surface and the lower surface of the inelastic insulating housing, respectively to allow a lower end portion of the electro-conductive part bump corresponding to the inelastic insulating housing is accommodated in the through hole while forming the space portion. Such the test socket is depicted in FIG. 8.

Figure 8:
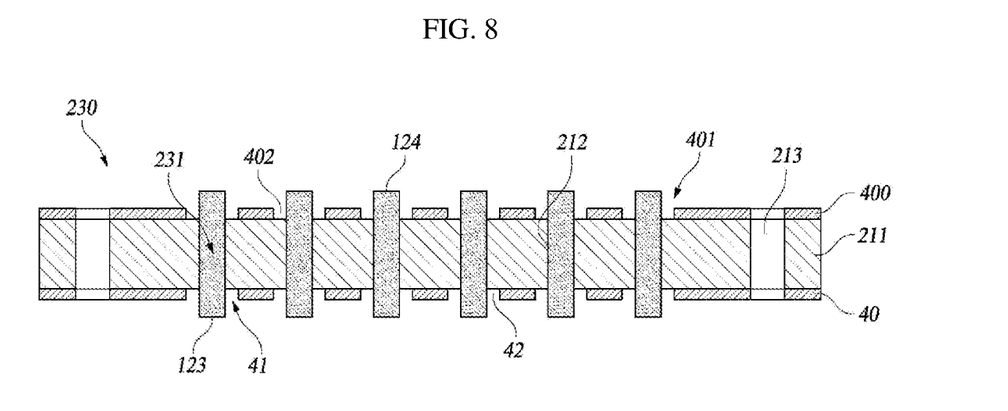

A test socket 230 shown in FIG. 8 includes the inelastic insulating housing 211 having the plurality of housing holes 212 formed therein and a plurality of electro-conductive parts 231 disposed in the plurality of housing holes 212, respectively. Here, the electro-conductive part 231 includes the conductive part body positioned in the housing hole 212, and the electro-conductive part upper bump 124 and the electro-conductive part lower bump 123 connected to the conductive part body and protruding from the upper and lower surface of the inelastic insulating housing 211, respectively.

The compression-controlling sheets 400 and 40 having a predetermined thickness are attached to the upper and lower surfaces of the inelastic insulating housing 211, respectively. The compression-controlling sheet 400 is an integrated sheet in which a through hole 401 having a diameter larger than that of the electro-conductive part upper bump 124 is formed at a position corresponding to the electro-conductive part upper bump 124, and may be formed to have a thickness which is an about half of the thickness of the electro-conductive part upper bump 124. In addition, the compression-controlling sheet 400 is attached in a configuration in which a lower end portion of the electro-conductive part upper bump 124 corresponding to the inelastic insulating housing 211 is accommodated in the through hole 401 while forming a space portion 402 around the lower end portion. Simultaneously, the compression-controlling sheet 40 is an integrated sheet in which a through hole 41 having a diameter larger than that of the electro-conductive part lower bump 123 is formed at a position corresponding to the electro-conductive part lower bump 123, and may be formed to have a thickness which is an about half of the thickness of the electro-conductive part lower bump 123. In addition, the compression-controlling sheet 40 is attached in a configuration in which a lower end portion of the electro-conductive part lower bump 123 corresponding to the inelastic insulating housing 211 is accommodated in the through hole 41 while forming a space portion 42 around the lower end portion. Therefore, the space portions 402 and 42 are provided, respectively in regions other than region occupied by the electro-conductive part bumps 124 and 123 in regions of the through holes 401 and 41 of the compression-controlling sheets 400 and 40.

In the test sockets 220 and 230 shown in FIGS. 7 and 8, the electro-conductive body and the electro-conductive upper bump of each of the electro-conductive parts 221, 231 have a structural feature as below.

$$0.05 \leq \frac{Lb}{Lt} \leq 0.5$$

Here, Lt is the sum of a length of the electro-conductive part body and a length of the electro-conductive part upper bump 124, and Lb represents a length of the electro-conductive part upper bump 124.

In addition, in the test sockets 210, 220, 230 shown in FIGS. 6 to 8, it is preferable that a volume of the space portion 42 or 402 of the through hole 41 or 401 is within a range of values greater than 0.2 times and less than 1.2 times a volume of the upper end portion 122 of the electro-conductive part lower bump 123 or the electro-conductive portion upper bump 124.

Although the present disclosure has been described with a preferred example, a scope of the present disclosure is not limited to the configuration described and illustrated above.

For example, although the electro-conductive part has both the electro-conductive part upper bump and the electro-conductive part lower bump, the lower compression-controlling sheet may be formed only on a portion on which the electro-conductive part lower bump is formed, and on the contrary, it is also possible to form the upper compression-controlling sheet only on a portion on which the electro-conductive part upper bump is formed.

In addition, although it has been described that the compression-controlling sheet has a thickness which is about a half of the thickness of the electro-conductive part bump, the compression-controlling sheet is not limited thereto and may be variously modified.

In addition, a pressure transmission structure for transmitting a pressurizing force of the pusher 130 to the device 10 under inspection is not limited to the illustrated one, but may be variously modified.

In addition, although the drawings depict the configuration in which the test socket is assembled with the guide housing 160 capable of guiding the device 10 under inspection and is secured to the tester 30, the test socket may be assembled with a variety of other structural components that are coupled to the tester.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A test socket provided in a test apparatus in which a device under inspection having a terminal is connected to a tester, which generates a test signal, for testing the device under inspection, the test socket comprising:
   an inelastic insulating housing formed of an inelastic insulating material and provided with a plurality of housing holes formed therein to pass therethrough in a thickness direction thereof, the inelastic insulating housing formed of polyimide;
   a plurality of electro-conductive parts formed to have a configuration in which a plurality of electro-conductive particles are contained in an elastic insulating material, each of the electro-conductive parts comprising:
      an electro-conductive part body having a lower end portion to be connected to a signal electrode of the tester placed below the inelastic insulating housing and an upper end portion disposed in the housing hole to be connected to the terminal of the device under inspection placed on the inelastic insulating housing; and
      an electro-conductive part lower bump connected to the electro-conductive part body to protrude from a lower surface of the inelastic insulating housing; and
   a lower compression-controlling sheet attached to the lower surface of the inelastic insulating housing and having one or more through holes formed therein to allow a lower end portion of each electro-conductive part lower bump to be accommodated in the through hole while forming a space portion around the lower end portion,
   wherein the inelastic insulating housing has an alignment hole passing therethrough in the thickness direction, and the alignment hole is configured to enable an alignment pin of a component for securing the inelastic insulating housing to the tester to pass therethrough.

2. The test socket of claim 1, wherein a volume of the space portion of the through hole is within a range of values greater than 0.2 times and less than 1.2 times a volume of an upper end portion of the electro-conductive part lower bump.

3. The test socket of claim 1, wherein the electro-conductive part satisfies the follow condition:

$$0.05 \le \frac{Lb}{Lt} \le 0.5$$

where Lt is the sum of a length of the electro-conductive part body and a length of the electro-conductive part lower bump, and Lb is a length of the electro-conductive part lower bump.

4. The test socket of claim 1, wherein the inelastic insulating housing and the lower compression-controlling sheet are formed of the same material.

5. The test socket of claim 1, wherein the inelastic insulating housing and the lower compression-controlling sheet are integrally formed with each other.

6. The test socket of claim 1, wherein the electro-conductive part comprises an electro-conductive part upper bump connected to the electro-conductive part body to protrude from an upper surface of the inelastic insulating housing, and the test socket comprises an upper compression-controlling sheet attached to the upper surface of the inelastic insulating housing and having a through hole formed therein to allow a lower end portion of each electro-conductive part upper bump to be accommodated in the through hole while forming a space portion around the lower end portion.

7. The test socket of claim 6, wherein a volume of the space portion of the through hole is within a range of values greater than 0.2 times and less than 1.2 times a volume of an upper end portion of the electro-conductive part upper bump.

8. The test socket of claim 7, wherein the electro-conductive part satisfies the follow condition:

$$0.05 \le \frac{Lb}{Lt} \le 0.5$$

where Lt is the sum of a length of the electro-conductive part body and a length of the electro-conductive part upper bump, and Lb is a length of the electro-conductive part upper bump.

9. A test socket provided in a test apparatus in which a device under inspection having a terminal is connected to a tester, which generates a test signal, for testing the device under inspection, the test socket comprising:
   an inelastic insulating housing formed of an inelastic insulating material and provided with a plurality of housing holes formed therein to pass therethrough in a thickness direction thereof, the inelastic insulating housing formed of polyimide;

a plurality of electro-conductive parts formed to have a configuration in which a plurality of electro-conductive particles are contained in an elastic insulating material, each of the electro-conductive parts comprising:

an electro-conductive part body having a lower end portion to be connected to a signal electrode of the tester placed below the inelastic insulating housing and an upper end portion disposed in the housing hole to be connected to the terminal of the device under inspection placed on the inelastic insulating housing; and an electro-conductive part upper bump connected to the electro-conductive part body to protrude from an upper surface of the inelastic insulating housing; and an upper compression-controlling sheet attached to the upper surface of the inelastic insulating housing and having a through hole formed therein to allow a lower end portion of each electro-conductive part upper bump to be accommodated in the through hole while forming a space portion around the lower end portion, wherein the inelastic insulating housing has an alignment hole passing therethrough in the thickness direction, and the alignment hole is configured to enable an alignment pin of a component for securing the inelastic insulating housing to the tester to pass therethrough.

10. A test apparatus in which a device under inspection having a terminal is connected to a tester, which generates a test signal, for testing the device under inspection, the test apparatus comprising:

a test socket configured to electrically mediate the tester and the device under inspection for enabling a test signal of the tester to be transmitted to the device under inspection;

a guide housing coupled to the tester for securing the test socket to the tester, and being provided with an alignment pin inserted into a securing hole of the tester; and a pusher being movable to approach the tester or to be moved away from the tester, thereby providing a pressurizing force capable of pressurizing the device under inspection placed on the test socket towards the tester, wherein the test socket comprises:

an inelastic insulating housing formed of an inelastic insulating material, the inelastic insulating housing formed of polyimide and being provided with a plurality of housing holes formed therein to pass therethrough in a thickness direction thereof and an alignment hole formed therein to pass therethrough in the thickness direction thereof to allow the alignment pin to pass through the alignment hole;

a plurality of electro-conductive parts formed to have a configuration in which a plurality of electro-conductive particles are contained in an elastic insulating material, each of the electro-conductive parts comprising:

an electro-conductive part body having a lower end portion to be connected to a signal electrode of the tester placed below the inelastic insulating housing and an upper end portion disposed in the housing hole to be connected to the terminal of the device under inspection placed on the inelastic insulating housing; and one or more electro-conductive part bumps connected to the electro-conductive part body to protrude from at least one of upper and lower surfaces of the inelastic insulating housing; and a compression-controlling sheet attached to a surface of the inelastic insulating housing on which the electro-conductive part bump is formed, and having a through hole formed therein to allow a lower end portion of each electro-conductive part bump to be accommodated in the through hole while forming a space portion around the lower end portion.

* * * * *